United States Patent
Zhu

(10) Patent No.: US 9,698,806 B2
(45) Date of Patent: *Jul. 4, 2017

(54) DYNAMIC POWER SWITCHING IN CURRENT-STEERING DACS

(71) Applicant: MaxLinear, Inc., Carlsbad, CA (US)

(72) Inventor: Jianyu Zhu, San Diego, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/218,586

(22) Filed: Jul. 25, 2016

(65) Prior Publication Data

US 2016/0336950 A1    Nov. 17, 2016

Related U.S. Application Data

(63) Continuation of application No. 14/869,268, filed on Sep. 29, 2015, now Pat. No. 9,461,666, which is a continuation of application No. 14/455,361, filed on Aug. 8, 2014, now Pat. No. 9,148,160.

(60) Provisional application No. 61/865,759, filed on Aug. 14, 2013.

(51) Int. Cl.
*H03M 1/66* (2006.01)
*H03M 1/08* (2006.01)
*H03M 1/00* (2006.01)
*H04B 15/02* (2006.01)
*H03M 1/74* (2006.01)

(52) U.S. Cl.
CPC ......... *H03M 1/0863* (2013.01); *H03M 1/002* (2013.01); *H03M 1/66* (2013.01); *H03M 1/664* (2013.01); *H04B 15/02* (2013.01); *H03M 1/742* (2013.01)

(58) Field of Classification Search
CPC .... H03M 1/0863; H03M 1/002; H03M 1/664; H03M 1/66; H03K 19/20; H03K 19/0185; H03K 19/09432; H03K 3/013
USPC .................................................. 341/130–160
See application file for complete search history.

(56) References Cited

U.S. PATENT DOCUMENTS

| | | | |
|---|---|---|---|
| 5,684,710 A | 11/1997 | Ehlers et al. | |
| 8,723,712 B1 | 5/2014 | Kabir et al. | |
| 9,148,160 B2 | 9/2015 | Zhu | |

(Continued)

*Primary Examiner* — Lam T Mai
(74) *Attorney, Agent, or Firm* — McAndrews, Held & Malloy, Ltd.

(57) ABSTRACT

Methods and systems are provided for dynamic power switching in current-steering digital-to-analog converters (DACs). A DAC circuit may be configured to apply digital-to-analog conversions based on current steering, and to particularly incorporate use of dynamic power switching during conversions. The DAC circuit may comprise a main section, which may connect a main supply voltage to a main current source. The main section may comprise a positive-side branch and a negative-side branch, which may be configured to steer positive-side and negative-side currents, such as in a differential manner, to effectuate the conversions. The dynamic power switching may be applied, for example, via a secondary section connecting a main current source in the DAC circuit to a secondary supply voltage. The secondary supply voltage may be configured such that it may be less than the main supply voltage used in driving the current steering in the DAC circuit.

22 Claims, 6 Drawing Sheets

(56) References Cited

U.S. PATENT DOCUMENTS 9,461,666 B2 * 10/2016 Zhu .................... H03M 1/0863
2014/0167996 A1 6/2014 Teterwak

* cited by examiner

DYNAMIC POWER SWITCHING IN CURRENT-STEERING DACS

CLAIM OF PRIORITY

This application is a continuation of U.S. patent application Ser. No. 14/869,268, filed on Sep. 29, 2015, which is a continuation of U.S. patent application Ser. No. 14/455,361, filed on Aug. 8, 2014, which claims the benefit of the U.S. Provisional Patent Application No. 61/865,759, filed on Aug. 14, 2013. Each of the above identified applications is hereby incorporated herein by reference in its entirety.

TECHNICAL FIELD

Aspects of the present disclosure relate to communications. More specifically, certain implementations of the present disclosure relate to methods and systems for dynamic power switching in current-steering DACs.

BACKGROUND

Existing methods and systems for performing digital-to-analog conversions may be inefficient. Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and method is provided for dynamic power switching in current-steering DACs, substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

Certain example implementations may be found in method and system for non-intrusive noise cancellation in electronic devices, particularly in user-supported devices. As utilized herein the terms "circuits" and "circuitry" refer to physical electronic components ("hardware") and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
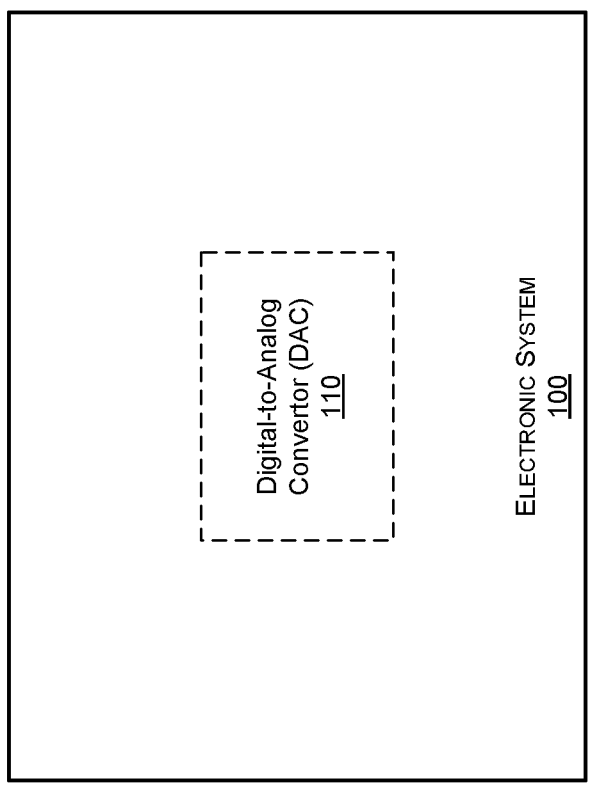
FIG. 1 illustrates an example electronic system that may be operable to perform digital-to-analog conversions.

FIG. 1 illustrates an example electronic system that may be operable to perform digital-to-analog conversions. Shown in FIG. 1 is an electronic system 100.

The electronic system 100 may comprise suitable circuitry for implementing various aspects of the present disclosure. In this regard, the electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols.

Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+(e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 250 comprise Ethernet (IEEE 802.3), Fiber Distributed Data Interface (FDDI), Integrated Services Digital Network (ISDN), cable television and/or internet (ATSC, DVB-C, DOCSIS), and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow providing output to and/or obtaining input from user(s) of the electronic system 100. In this regard, the electronic system 100 may comprise components or subsystems for enabling obtaining user input and/or to provide output to the user. For example, the electronic system 100 may be operable to support audio output operations, whereby acoustic signals may be generated and/or outputted via suitable output devices (e.g., loudspeakers). In this regard, the output signals may be generated based on content, which may be in digital form (e.g., digitally formatted music or the like).

Examples of electronic systems may comprise handheld electronic devices (e.g., cellular phones, smartphones, or tablets), personal computers (e.g., laptops or desktops), servers, dedicated media devices (e.g., televisions, game consoles, or portable media players, etc.), set-top boxes (STBs) or other similar receiver systems (e.g., satellite receivers), and the like. The disclosure, however, is not limited to any particular type of electronic system.

In operation, the electronic system 100 may be operable to perform various operations, functions, applications and/or services. For example, in some instances, electronic system 100 may be configured or used to communicate data (to and/or from the system), and to process the communicated data. In this regard, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme. Accordingly, handling of digital communications (e.g., in the electronic system 100) may typically require performing, inter alia, digital-to-analog conversions at the transmitting end and analog-to-digital conversions at the receiving end. For example, the electronic device may comprise one or more digital-to-analog converters (DACs) 110. In this regard, each DAC 110 may comprise circuitry, interfaces, logic and/or code for performing digital-to-analog conversions.

Each DAC 110 may comprise suitable circuitry, interfaces, logic, and/or code for performing digital-to-analog conversions. For example, the DAC 110 may be utilized during signal processing, such as to allow converting digital data into analog waveforms (e.g., corresponding to and/or being embedded into acoustic signals, radio frequency (RF) signals, etc.). The disclosure, however, is not limited to any particular use scenario, and may be utilized in any appropriate setup performing or requiring digital-to-analog conversions.

Various architectures and/or designs may be used in performing digital-to-analog conversions and/or for implementing digital-to-analog converters (DACs). For example, DACs may be implemented based on current-steering. In this regard, in current-steering DACs, the conversion from digital to analog may be performed based on steering of current from sources, with the steering being controlled or adjusted based on the input digital code. There may be certain issues and/or disadvantages with use of current-steering DACs, however. For example, typically current-steering DACs may be terminated in a diode connected transistor when further amplification is desired. Current flowing through the diode connected transistor may be then mirrored and scaled up for amplification. The disadvantage of such termination is that it may reduce the voltage drop across the current-steering DAC stage giving rise to various DAC non-idealities. Also the signal voltage swing due to signal current flowing in the diode connected transistor may give rise to the undesirable signal dependent DAC switching operation. Another issue with the diode connected termination is achieving large current gain. When high current gain is desired, the current mirror bandwidth may suffer due to large capacitive loading at the diode connected termination.

Accordingly, in various implementations in accordance with the present disclosure, the problems described above may be solved and/or remedied. For example, these problems may be addressed with an introduction of low input impedance termination stage. An example implementation incorporating a low input impedance termination stage is described in more detail with respect to FIG. 2.

Figure 2:
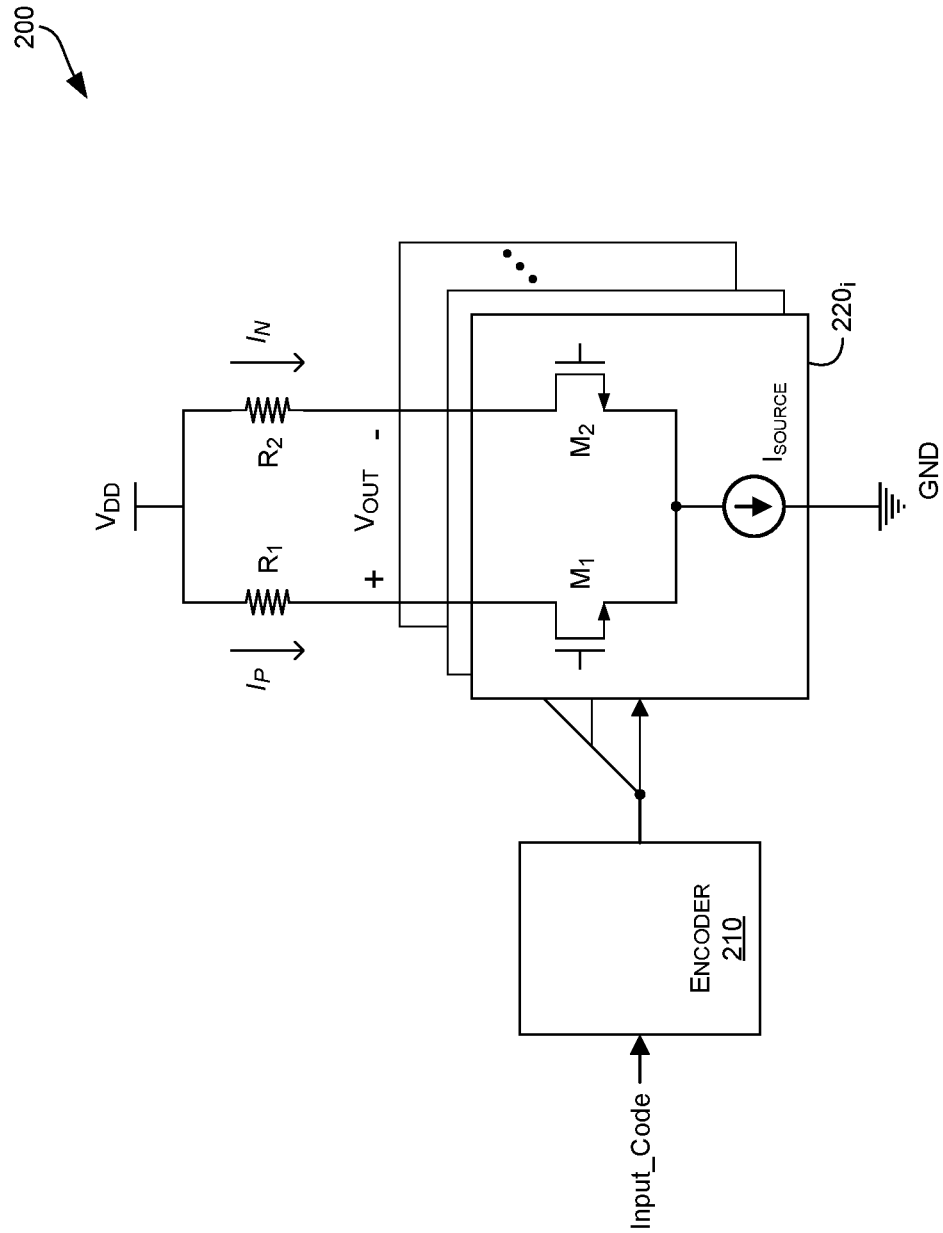
FIG. 2 illustrates an example current-steering digital-to-analog convertor (DAC).

FIG. 2 illustrates an example current-steering digital-to-analog convertor (DAC). Shown in FIG. 2 is a digital-to-analog convertor (DAC) 200.

The DAC 200 may comprise suitable circuitry for performing digital-to-analog conversions. For example, the DAC 200 may correspond to the DAC 100, substantially as described with respect to FIG. 1. The DAC 200 may be utilized, for example, during signal processing, such as to allow converting digital data into analog waveforms. The disclosure, however, is not limited to any particular use scenario, and may be utilized in any appropriate setup performing or requiring digital-to-analog conversion.

In the example implementation shown in FIG. 2, the DAC 200 may be implemented as a typical current-steering DAC. For example, the DAC 200 may comprise a plurality of DAC cells $220_i$, corresponding to an array of current sources ($I_{SOURCE}$). Each current source $I_{SOURCE}$ (of each DAC cell $220_i$) may be steered to either side of a differential load (e.g., using a pair of resistors $R_1$ and $R_2$), which may be applied to two switching branches, comprising a pair of transistors $M_1$ and $M_2$, which are coupled to a supply voltage ($V_{DD}$) through the differential load resistors R1 and R2, respectively. The transistors $M_1$ and $M_2$ may be NMOS transistors. The disclosure is not so limited, however, and other types of transistors (e.g., PMOS transistors, CMOS transistors, etc.) may be used. Thus, two currents may flow through each DAC cell $220_i$, a positive-side current ($I_P$) and a negative-side current ($I_N$), corresponding to the positive and negative halves of the output signal, respectively. The load within each DAC cell $220_i$ may be differentially adjusted in each side, thus resulting in adjustment of the values of $I_P$ and $I_N$. In this regard, the DAC 200 may comprise an encoder 210, which may be adapted to generate control signals to the current-steering DAC cells based on the input code (i.e. the digital code being converted). The control signals may, for example, control operations of the transistors M1 and M2, which in turn controls the values of the currents $I_P$ and $I_N$ in each DAC cell $220_i$.

One possible issue with typical current-steering DACs, such as the one shown in FIG. 2, may be excessive power consumption. For example, because conversion performed in each DAC cell $220_i$ is simply based on steering current to either side of the differential load, the total current running in each DAC cell $220_i$ may remain the same (i.e. combined value of $I_P$ and $I_N$, through R1 and R2 remains constant as long as the DAC cell is operating). In other words, in typical current-steering DAC cells power may be wasted because current may always be running through the DAC cell (in either one or in both of the load branches) through them even when switching to values corresponding to digital low or high.

Figure 3:
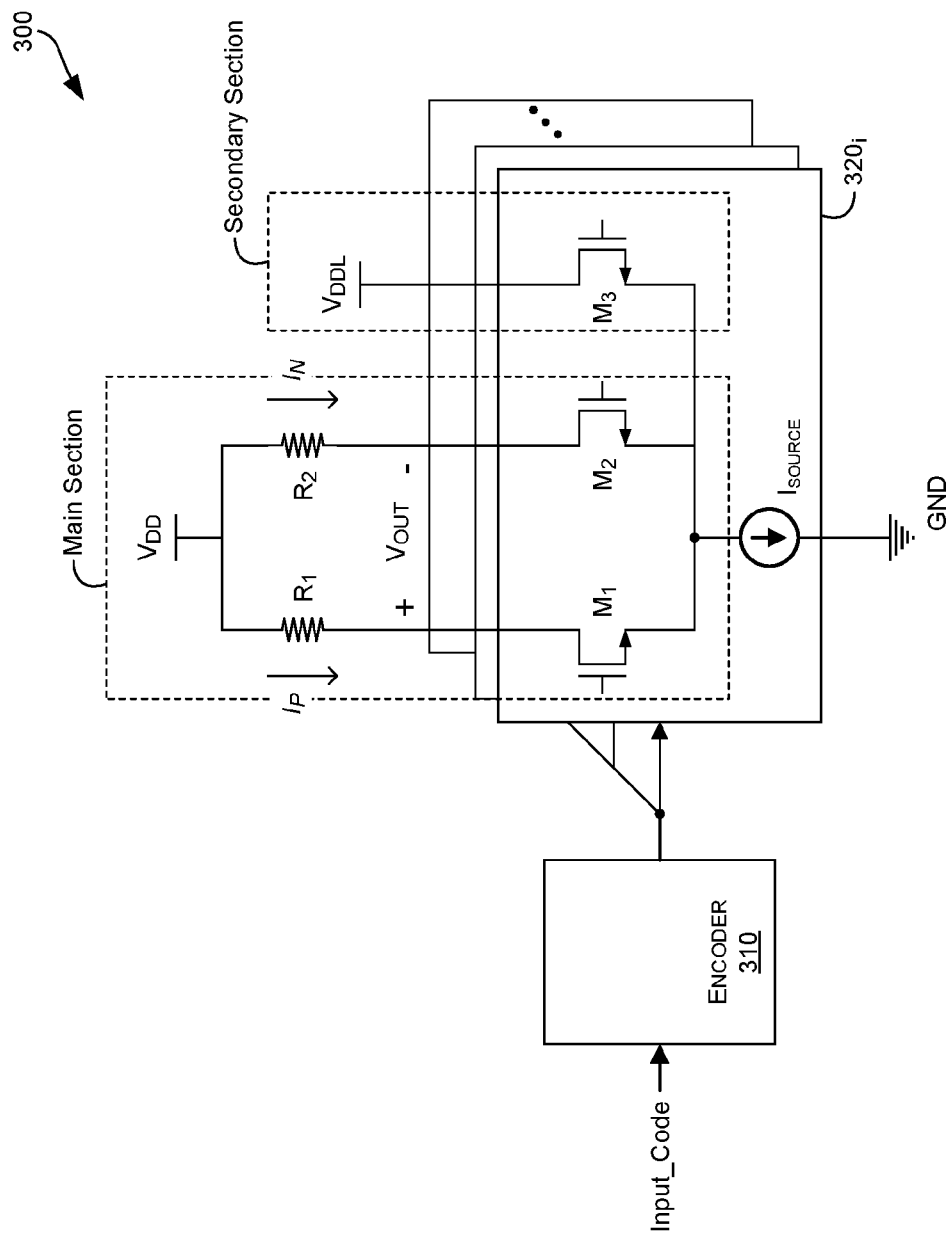
FIG. 3 illustrates an example current-steering digital-to-analog convertor (DAC) with dynamic power switching.

FIG. 3 illustrates an example current-steering digital-to-analog convertor (DAC) with dynamic power switching. Shown in FIG. 3 is a digital-to-analog convertor (DAC) 300.

The DAC 300 may be substantially similar to DAC 200, as described with respect to FIG. 2. In this regard, the DAC 300 also may be configured to provide digital-to-analog conversions based on current-steering. The DAC 300, however, may be modified to provide dynamic power switching. For example, the DAC 200 may comprise a plurality of DAC cells $320_i$, corresponding to an array of current sources ($I_{SOURCE}$). In this regard, each DAC cell $320_i$ in the DAC 300 may comprise, as a 'main section' the same topology of the DAC cells $220_i$ of the DAC 200, as described with respect to FIG. 2 for example. The main section of the DAC cells $320_i$ may be configured to provide the digital-to-analog conversions. In addition, each DAC cell $320_i$ may comprise a secondary section that is particularly configured to provide the desired dynamic power switching. For example, the secondary section may comprise a secondary supply voltage ($V_{DDL}$) and a switch (e.g., a third transistor $M_3$, which may be a NMOS transistor for example) that may be connected to each DAC cell's current source ($I_{SOURCE}$), to enable steering the current to the secondary supply.

The dynamic power switching may be achieved by controlling the switch (M3) and/or the secondary supply voltage. For example, the power switching may be activated when the switch (M3) is closed. Also, the secondary supply voltage may be set and/or configured to provide optimized performance. For example, the secondary supply voltage ($V_{DDL}$) may be set and/or configured such that it may be lower than the main supply voltage $V_{DD}$ ($V_{DDL} < V_{DD}$), so that when the current is steered to the secondary supply, less power may be consumed. In some instances, this may be done to the entire DAC array—that is all the DAC cells $320_i$, or to only some selected elements of the array, such as the MSB elements for example.

Use of dynamic power switching, in current-steering based DACs, may be useful in various applications, such as applications where the current of one or multiple cells may be steered away from the differential load sometimes. For example, dynamic power switching, in accordance with the above described technique, may be used in implementing Class-B digital-to-analog convertors (DACs). In this regard, in Class-A DACs, the output component may be configured to allow current flow for the entire range of input or output signals—e.g., there is always current flowing through one or both of the negative-side and positive-side branches. Thus, in terms of output waveforms, Class-A and Class-B DACs reproduce the same differential waveform but different single-ended waveform. Class-A DACs may be configured to reproduce the waveform in its entirety, and so that the total current ($I_{total}$) in such DACs is only steered into the load resistor pair but remains constant regardless of the DAC input code ($I_{total} = I_P + I_N$, with $I_P$ and $I_N$ corresponding to the currents steered into the load resistors $R_1$ and $R_2$). In Class-B DACs, on the other hand, the total load current is a function of input code. In this regard, the current flows through each of the negative-side and positive-side branches of the DAC circuitry during the corresponding part of the output cycle—i.e., the differential load sides are adjusted such that each of $I_N$ and $I_P$ only flows during the negative and positive halves of the output signal, respectively. Example current profiles of Class-A and Class-B DACs are illustrated in FIG. 4.

Thus, Class-B DACs would be more power efficient than Class-A DAC. Accordingly, the described technique may provide an effective way to implement a Class-B current-steering DAC without requiring shutting off of the current sources, which slows down the DAC speed significantly.

Another possible application is Return-to-Zero digital-to-analog convertors (RZ DACs). In this regard, in a Return-to-Zero DAC (RZ DAC), all the currents may be steered away from the load, such as periodically (e.g., every half clock cycle or every other clock cycle), to generate a zero differential output. Doing so may enable reducing inter-symbol-interference (ISI) in the DAC and improves linearity. However, because the currents are steered to the load only half of the time, half of the power may be wasted, or in other words, to achieve the same original output power as a Non-Return-to-Zero DAC (NRZ DAC), the total DAC power would have to be doubled. Accordingly, employing the technique described in this disclosure, i.e., to steer the current to a lower supply during the Return-to-Zero phase of the half clock cycle, can reduce the total power consumption.

Figure 4:
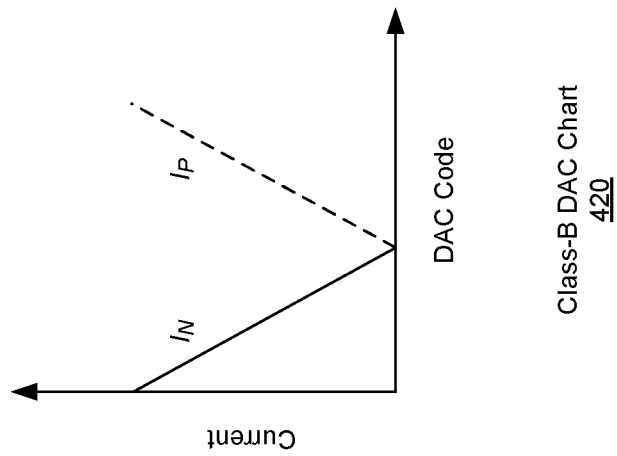
FIG. 4 illustrates example code based current flow diagrams for Class-A and Class-B digital-to-analog convertors (DACs).
Figure 4:
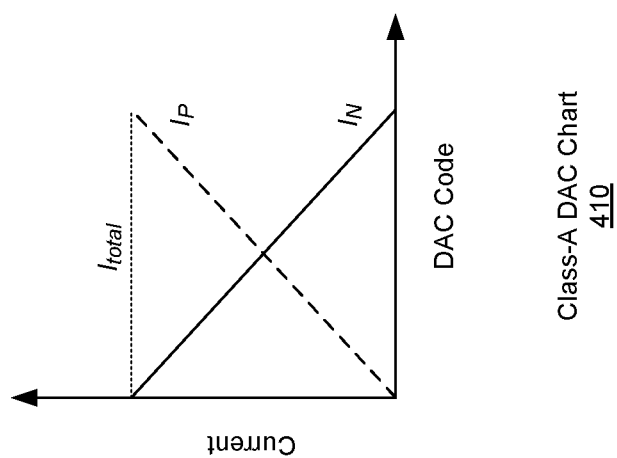

FIG. 4 illustrates example code based current flow diagrams for Class-A and Class-B digital-to-analog convertors (DACs). Shown in FIG. 4 are current diagrams 410 and 420, corresponding to code based current flows for Class-A and Class-B DACs.

The current diagram 410 depicts example current profile of a Class-A DAC, in which the total current ($I_{total}$) steered into the load resistor pair (e.g., corresponding to the positive-side and the negative-side of the output) remains constant (e.g., $I_{total} = I_P + I_N$, with $I_P$ and $I_N$ corresponding to the currents steered into the load resistors $R_1$ and $R_2$), regardless of the DAC input code. Thus, when $I_P$ decreases $I_N$ increases, and vice versa (so that $I_{total}$ remains the same, for example).

On the other hand, the current diagram 420 depicts example current profile of a Class-B DAC, whereby the total load current may be simply a function of input code. Thus, fall of the positive-side current $I_P$ does not necessitate rise in negative-side current $I_N$.

Figure 5:
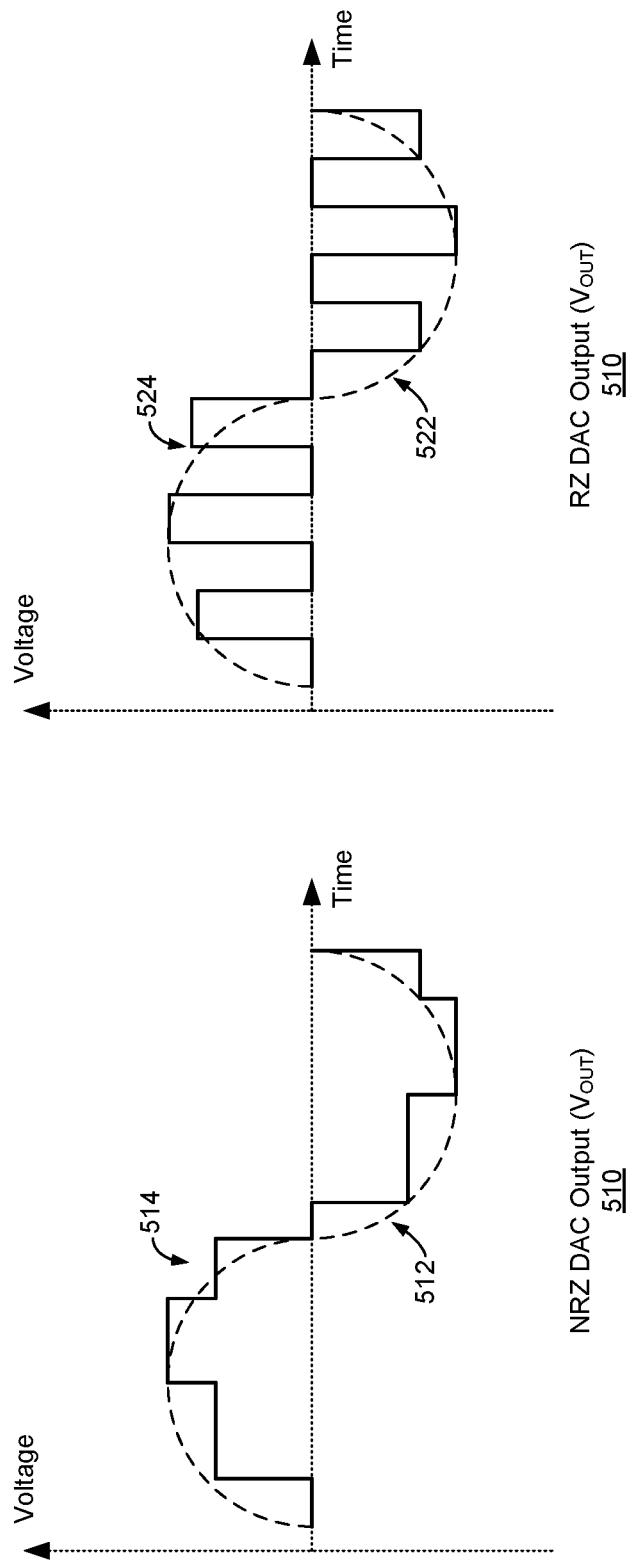
FIG. 5 illustrates example waveform diagrams for Non-Return-to-Zero digital-to-analog convertors (NRZ DACs) and Return-to-Zero digital-to-analog convertors (RZ DACs).

FIG. 5 illustrates example waveform diagrams for Non-Return-to-Zero digital-to-analog convertors (NRZ DACs) and Return-to-Zero digital-to-analog convertors (RZ DACs). Shown in FIG. 5 are waveform diagrams 510 and 520, corresponding to output waveforms of example NRZ DAC and RZ DAC, respectively.

As shown in the example waveform diagrams 510 and 520, a NRZ DAC and a RZ DAC may have the similar overall output waveform (output voltage: $V_{OUT}$) 512 and 522—a zero differential output, even though actual real-time voltage may vary, as shown by example real voltage graphs 514 and 524—where the voltage (524) in the RZ DAC is shown to return to zero at particular points (e.g., every half clock cycle or every other clock cycle). In a legacy implementation, the return to zero in RZ DAC may be achieved by steering all the currents in the RZ DAC circuit away from the load, every half clock cycle or every other clock cycle, to generate a zero differential output. Doing so, however, may result in wasting of power as the currents are steered to the load only half of the time. In other words, to achieve the same original output power as a NRZ DAC, the total DAC power would have to be doubled. However, in an enhanced implementation, in accordance with the present disclosure, the power waste may be reduced, such as by using the secondary power supply ($V_{DDL}$) when steering the currents to return to zero, resulting in less power consumption to achieve a zero differential output.

Figure 6:
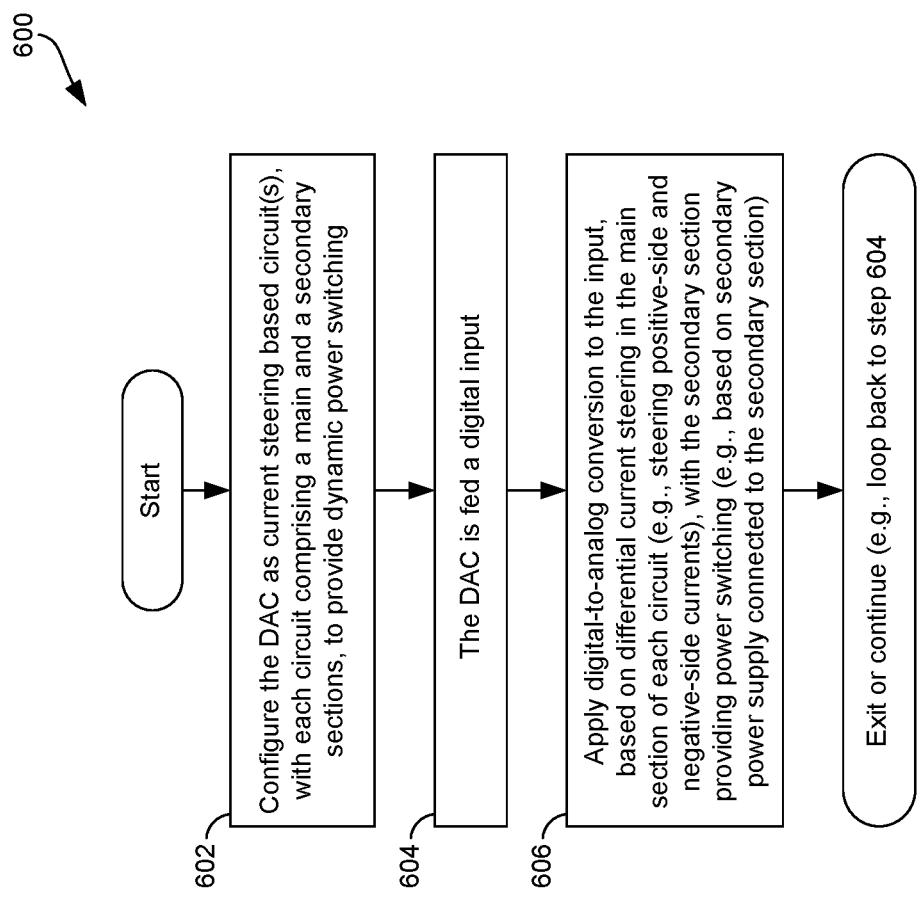
FIG. 6 is a flowchart illustrating an example process for configuring and using a current-steering digital-to-analog convertor (DAC) with dynamic power switching.

FIG. 6 is a flowchart illustrating an example process for configuring and using a current-steering digital-to-analog convertor (DAC) with dynamic power switching. Referring to FIG. 6, there is shown a flow chart 600, comprising a plurality of example steps.

In step 602, a digital-to-analog converter (DAC) DAC may be constructed and/or configured using one or more current steering circuits, with each circuit comprising main and secondary branches, optimized for providing digital-to-analog conversion based on current steering, with dynamic power steering, as described with respect to FIG. 3 for example. This may be done at design and/or manufacturing time, but it may also comprise additional configuration and/or adjustment during operation of the DAC. For example, a DAC may be structured and/or designed with the similar topology as DAC 300, for example. This may comprise selecting (or configuring) particular power supplies (main and secondary), particular main current supply, particular resistor(s), and/or particular transistor elements.

In step 604, a digital input may be fed into the DAC, to enable converting the input into corresponding analog waveforms.

In step 606, digital-to-analog conversion of the input may be performed, based on differential current steering in the main branch of each circuit (e.g., steering positive-side and negative-side currents), with the secondary branch providing power switching (e.g., based on secondary supply voltage to which the secondary branch is connected). For example, the DAC may be a class-B DAC, in which the secondary branch may be configured and/or used to enable the required current-steering without requiring shutting off the current sources.

The process may then terminate (if no further conversion(s) are required), or may continue, such as by looping back to step 604, to enable handling additional input(s).

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for non-intrusive noise cancelation.

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein. Another typical implementation may comprise an application specific integrated circuit or chip.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form. Accordingly, some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A digital-to-analog converter (DAC), the DAC comprising:
a positive-side load coupled to a main voltage;
a negative-side load coupled to the main voltage, an analog output being produced according to a positive-side current though the positive-side load and a negative-side current though the negative-side load; and
one or more cells, each cell comprising:
a positive-side branch selectably coupling the main voltage to a current source via the positive-side load;
a negative-side branch selectably coupling the main voltage to the current source via the negative-side load; and
a secondary section selectably coupling the current source to a secondary voltage.

2. The DAC of claim 1, wherein the secondary section of each of the one or more cells comprises a transistor.

3. The DAC of claim 1, wherein the positive-side load comprises a first resistor and the negative-side load comprises a second resistor.

4. The DAC of claim 1, wherein the positive-side branch of each of the one or more cells comprises a transistor and the negative-side branch of each of the one or more cells comprises a transistor.

5. The DAC of claim 1, wherein the positive-side current flows through the positive-side load according to a first digital code and the negative-side current flows through the negative-side load according to a second digital code.

6. The DAC of claim 1, wherein in each of the one or more cells, the secondary section selectably couples the current source to the secondary voltage according to a third digital code.

7. The DAC of claim 1, wherein in each of the one or more cells, the secondary section selectably steers the current source to the secondary voltage according to a third digital code.

8. The DAC of claim 1, wherein the negative-side current flows during a negative part of the analog output and the positive-side current flows during a positive part of the analog output.

9. The DAC of claim 1, wherein the secondary section couples the current source to the secondary voltage when the current source is not coupled to the main voltage.

10. The DAC of claim 1, wherein the secondary section periodically couples the current source to the secondary voltage.

11. The DAC of claim 1, wherein a digital input to the system is synchronized to a clock cycle, the secondary section coupling the current source to the secondary voltage during a portion of the clock cycle.

12. An integrated circuit, the integrated circuit comprising:
   a positive-side load coupled to a main voltage;
   a negative-side load coupled to the main voltage, an analog output being produced according to a positive-side current though the positive-side load and a negative-side current though the negative-side load; and
   one or more cells, each cell comprising:
      a positive-side switch selectably coupling the main voltage to a current source via the positive-side load;
      a negative-side switch selectably coupling the main voltage to the current source via the negative-side load; and
      a secondary section selectably coupling the secondary voltage to the current source.

13. The integrated circuit of claim 12, wherein the secondary section of each of the one or more cells comprises a transistor.

14. The integrated circuit of claim 12, wherein the positive-side load comprises a first resistor and the negative-side load comprises a second resistor.

15. The integrated circuit of claim 12, wherein the positive-side switch of each of the one or more cells comprises a transistor and the negative-side switch of each of the one or more cells comprises a transistor.

16. The integrated circuit of claim 12, wherein the positive-side current flows through the positive-side load according to a first digital code and the negative-side current flows through the negative-side load according to a second digital code.

17. The integrated circuit of claim 16, wherein in each cell of the one or more cells, the secondary section selectably couples the current source to the secondary voltage according to a corresponding bit in a third digital code.

18. The integrated circuit of claim 16, wherein in each cell of the one or more cells, the secondary section selectably steers the current source to the secondary voltage according to a corresponding bit in a third digital code.

19. The integrated circuit of claim 16, wherein the negative-side current flows during a negative part of the analog output and the positive-side current flows during a positive part of the analog output.

20. The integrated circuit of claim 16, wherein an encoder controls the secondary section in each cell of the one or more cells to couple the current source to the secondary voltage when the current source is not coupled to the main voltage.

21. The integrated circuit of claim 16, wherein an encoder controls the secondary section in each cell of the one or more cells to periodically couple the current source to the secondary voltage.

22. The integrated circuit of claim 16, wherein one or more digital signals control the positive-side switch and the negative-side switch, the one or more digital signals being synchronized to a clock cycle, wherein an encoder controls the secondary section in each cell of the one or more cells to periodically couple the current source to the secondary voltage during a portion of the clock cycle.

* * * * *